United States Patent
Lee et al.

(10) Patent No.: US 7,323,708 B2
(45) Date of Patent: Jan. 29, 2008

(54) PHASE CHANGE MEMORY DEVICES HAVING PHASE CHANGE AREA IN POROUS DIELECTRIC LAYER

(75) Inventors: Se-Ho Lee, Gyeonggi-do (KR); Young-Nam Hwang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 285 days.

(21) Appl. No.: 10/827,687

(22) Filed: Apr. 19, 2004

(65) Prior Publication Data

US 2005/0019975 A1    Jan. 27, 2005

(30) Foreign Application Priority Data

Jul. 23, 2003    (KR) .................. 10-2003-0050779

(51) Int. Cl.
*H01L 29/04* (2006.01)
*H01L 47/00* (2006.01)
*H01L 29/00* (2006.01)
*H01L 29/02* (2006.01)
*H01L 29/06* (2006.01)

(52) U.S. Cl. .................. 257/3; 257/1; 257/2; 257/4; 257/5; 257/296; 257/297; 257/298; 257/299; 257/300; 257/310; 257/311; 257/312; 257/313

(58) Field of Classification Search ............... 257/1–5, 257/296–300, 310–313
See application file for complete search history.

(56) References Cited

U.S. PATENT DOCUMENTS

| | | | | |
|---|---|---|---|---|
| 3,271,591 A | | 9/1966 | Ovshinsky | |
| 3,530,441 A | | 9/1970 | Ovshinsky | |
| 4,646,266 A | * | 2/1987 | Ovshinsky | 365/105 |
| 5,789,819 A | * | 8/1998 | Gnade et al. | 257/759 |
| 5,920,788 A | * | 7/1999 | Reinberg | 438/466 |
| 6,205,016 B1 | * | 3/2001 | Niu | 361/503 |
| 6,391,688 B1 | * | 5/2002 | Gonzalez et al. | 438/128 |
| 6,507,061 B1 | | 1/2003 | Hudgens et al. | |
| 6,764,894 B2 | * | 7/2004 | Lowrey | 438/238 |
| 6,777,705 B2 | * | 8/2004 | Reinberg et al. | 257/2 |
| 6,844,564 B2 | * | 1/2005 | Tanaka et al. | 257/3 |
| 6,864,522 B2 | * | 3/2005 | Krieger et al. | 257/296 |
| 7,037,762 B2 | * | 5/2006 | Joo et al. | 438/128 |
| 7,075,170 B2 | * | 7/2006 | Oku et al. | 257/632 |
| 2001/0029189 A1 | | 10/2001 | Mandyam | |
| 2001/0049189 A1 | | 12/2001 | Zahorik | |
| 2002/0012848 A1 | * | 1/2002 | Callahan et al. | 429/306 |
| 2003/0031045 A1 | * | 2/2003 | Hosotani | 365/158 |
| 2003/0186481 A1 | * | 10/2003 | Lung | 438/95 |
| 2003/0193063 A1 | * | 10/2003 | Chiang et al. | 257/295 |
| 2004/0026729 A9 | * | 2/2004 | Krieger et al. | 257/306 |
| 2004/0051094 A1 | * | 3/2004 | Ooishi | 257/5 |
| 2004/0074768 A1 | * | 4/2004 | Anex et al. | 204/294 |
| 2004/0113135 A1 | * | 6/2004 | Wicker | 257/2 |
| 2004/0113136 A1 | * | 6/2004 | Dennison | 257/2 |
| 2004/0113192 A1 | * | 6/2004 | Wicker | 257/298 |
| 2004/0113232 A1 | * | 6/2004 | Johnson et al. | 257/529 |
| 2004/0197947 A1 | * | 10/2004 | Fricke et al. | 438/102 |
| 2004/0264107 A1 | * | 12/2004 | Hunt et al. | 361/327 |
| 2005/0056825 A1 | * | 3/2005 | Bertin et al. | 257/20 |
| 2006/0043595 A1 | * | 3/2006 | Aratani et al. | 257/758 |

* cited by examiner

*Primary Examiner*—Ida M. Soward
(74) *Attorney, Agent, or Firm*—Myers Bigel Sibley & Sajovec, P.A.

(57) ABSTRACT

A phase change memory device includes a lower electrode and a porous dielectric layer having fine pores on the lower electrode. A phase change layer is provided in the fine pores of the porous dielectric layer. An upper electrode is provided on the phase change layer. Related manufacturing methods are also described.

13 Claims, 10 Drawing Sheets

180
PHASE CHANGE MEMORY DEVICES HAVING PHASE CHANGE AREA IN POROUS DIELECTRIC LAYER

RELATED APPLICATION

This application claims the benefit of Korean Patent Application No. 2003-50779, filed on Jul. 23, 2003, the disclosure of which is hereby incorporated herein by reference in its entirety as if set forth fully herein.

BACKGROUND OF THE INVENTION

1. Field of the Invention

The present invention relates to memory devices and methods for manufacturing the same and, more particularly, to phase change memory devices and methods for manufacturing the same.

2. Description of the Related Art

Electrically writable and erasable phase change materials are used in semiconductor memory devices. The phase change material can be electrically switched by a change between an amorphous state and a crystal state. See, for example, U.S. Pat. Nos. 3,271,591 and 3,530,441 to Ovshinsky. The phase change material can be switched in an incremental step, reflecting a change of a localized order, in order to provide a "gray scale" represented by various conditions of the localized order from the amorphous state to the crystal state. The phase change material also can be switched between two structural states of the localized order, that is, roughly amorphous and roughly crystal, thereby storing and retrieving binary information.

A semiconductor memory device that uses a phase change material may be referred to as a phase change memory device or a phase-change Random Access Memory (RAM). As the phase change material, a chalcogenide material is commonly used. Accordingly, phase change memories also may be referred to as chalcogenide memories. Other phase change materials also may be used. In order to initialize a detectable phase change of a localized arrangement, a relatively high energy may be used. That is, in order to obtain detectable changes of chemical and electronic bonding structures of the chalcogenide material, relatively high energy may be provided.

Figure 1A:
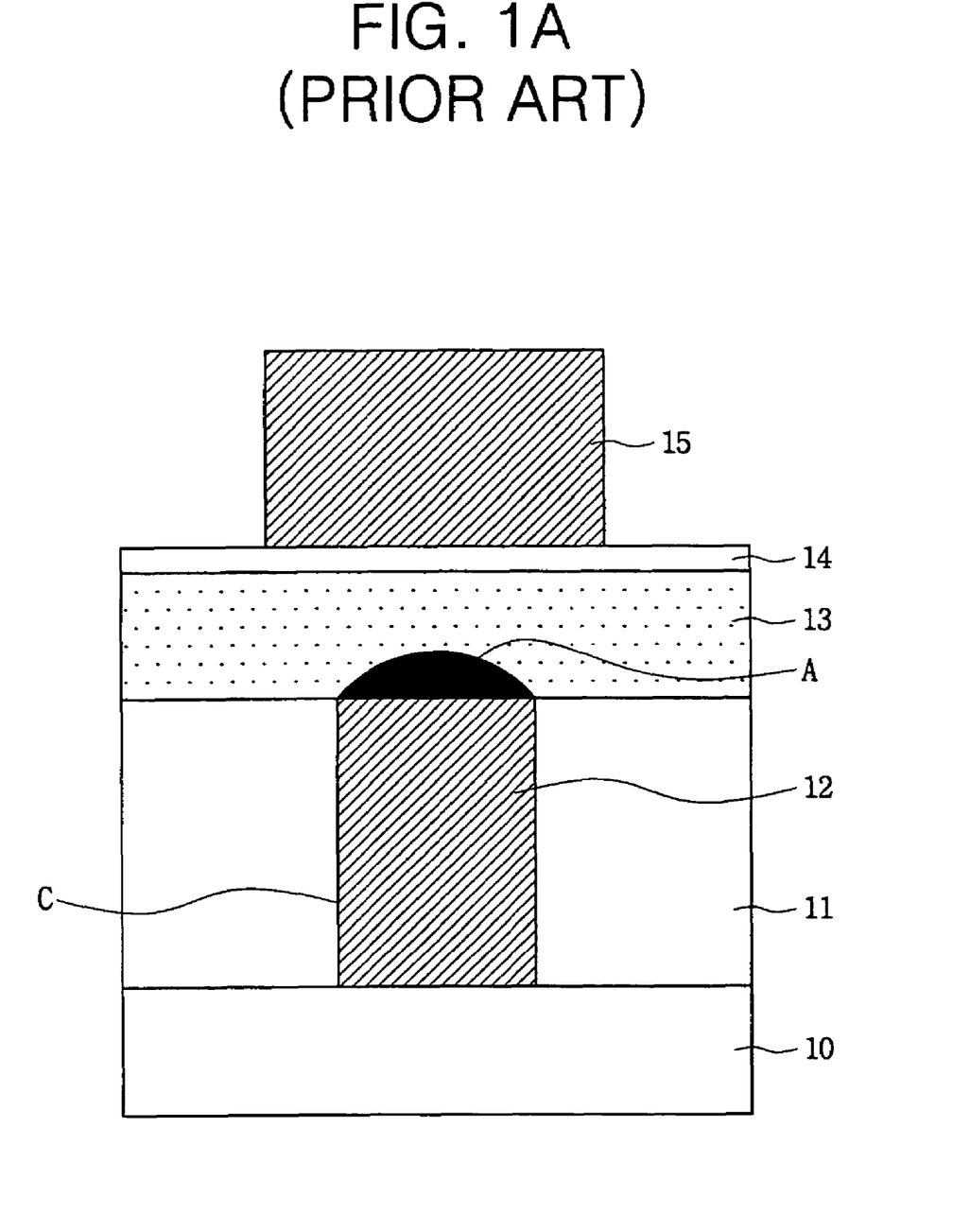
FIGS. 1A and 1B are cross-sectional views illustrating a structure of a phase change memory device according to a prior art.

FIG. 1A is a cross-sectional view illustrating a schematic structure of a phase change memory device disclosed in US published application No. 2001/0049189 to Zahorik, entitled to "*Small Electrode for Chalcogenide Memories*".

As shown in FIG. 1A, a conventional phase change memory device comprises a lower electrode 12 formed in a contact hole C within an interlayer insulating layer 11 covering a semiconductor substrate 10 and connected to the semiconductor substrate 10, a phase change layer 13 stacked on the lower electrode 12, a conductive adhesive film 14, and an upper electrode 15.

Figure 1B:
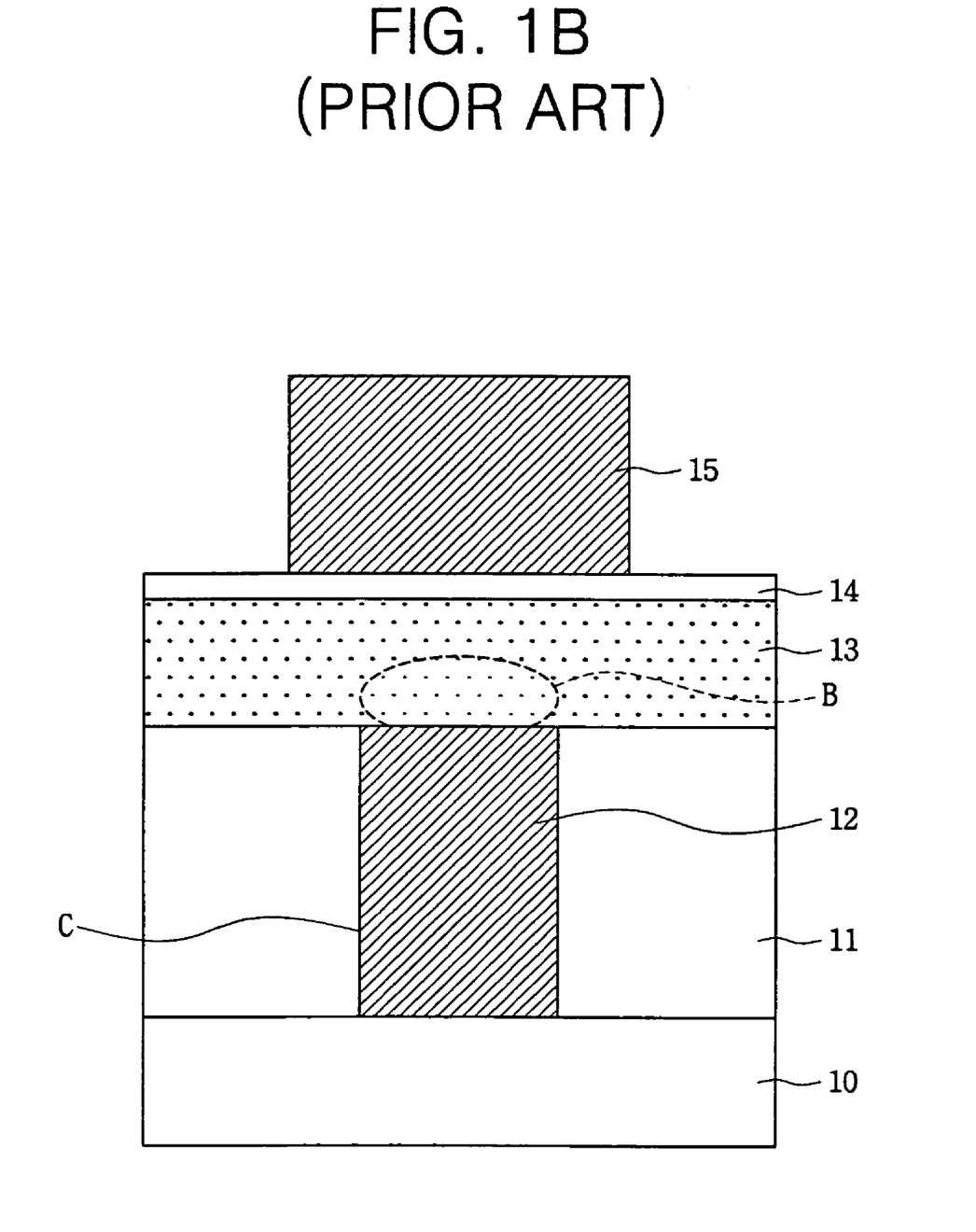

FIG. 1A shows a reset state where a part of the phase change layer 13 is changed into an amorphous state A, and FIG. 1B shows a set state where the phase change layer 13 is changed into a crystal state B. Reference numeral "A" in FIG. 1A represents that the phase change layer 13 is changed into the amorphous state, and reference numeral "B" in FIG. 1B represents that the phase change layer 13 is changed into the crystal state.

In order to increase current density applied to the phase change layer 13, the lower electrode 12 is formed within the contact hole C, to reduce the cross-sectional area, as shown in FIGS. 1A and 1B.

The conventional phase change memory device writes and reads data using the resistance change under the state of set or reset of the phase change layer 13. To this end, a relatively large programming current, for example several mA, may be used. The programming current generally is proportional to an area of the phase change layer 13 that contacts the lower electrode 12. Moreover, it may take hundreds of nanoseconds to several microseconds for the conventional phase change memory device to crystallize an amorphous region, which may affect the speed of the device. The crystallization speed is also generally proportional to an area of the amorphous region that contacts with the lower electrode. Therefore, in order to reduce the programming current and shorten the crystallization time, it may be desirable to reduce contact area between the phase change layer 13 and the lower electrode 12.

However, a size of a contact hole C that determines the contact area between the lower electrode 12 and the phase change layer 13 generally depends on a photolithography process, and it may be difficult to reduce the area of the lower electrode below a certain level.

SUMMARY OF THE INVENTION

Some embodiments of the present invention provide a phase change memory device comprising a lower electrode, and a porous dielectric layer on the lower electrode and having a plurality of fine pores therein. A phase change layer is provided in the fine pores. An upper electrode is provided on the phase change layer, remote from the lower electrode. In some embodiments, the phase change layer fills the fine pores. In other embodiments, the phase change layer is provided on the porous dielectric layer and fills the fine pores.

Other embodiments of the invention provide a semiconductor substrate and an interlayer insulating layer on the semiconductor substrate including thereon a contact hole. The lower electrode is in the contact hole and is connected to the semiconductor substrate.

According to other embodiments of the present invention, a phase change memory device includes a lower electrode and an absenced pattern phase change layer on the lower electrode. An upper electrode is provided on the absenced pattern phase change layer, remote from the lower electrode. As used herein, an "absenced pattern phase change layer" is a phase change layer having a basic circular, ellipsoidal and/or polygonal shape with one or more cutouts or voids in the basic shape. A phase change layer in fine pores of a dielectric layer provides one embodiment of absenced pattern phase change layer. In some embodiments, the absenced pattern phase change layer on the lower electrode extends across the lower electrode.

Yet other embodiments of the present invention provide methods for manufacturing a phase change memory device by forming a lower electrode on a semiconductor substrate and forming a porous dielectric layer that has a plurality of fine pores therein on the lower electrode. The phase change layer is formed in the fine pores in the porous dielectric layer. An upper electrode is formed on the phase change layer.

Some embodiments of the present invention can reduce or minimize a phase change area by forming an absenced pattern phase change layer such as a porous dielectric layer having a plurality of fine pores on the lower electrode, and forming the phase change layer in the fine pores in the porous dielectric layer. As such, a reduced or minimized phase change area may be formed, so that a programming current can be reduced and a crystallization time can be shortened.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will also be understood that when an element such as a layer, region or substrate is referred to as being "on" another element, it can be directly on the other element or intervening elements may also be present. Furthermore, relative terms such as "lower" or "upper" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various embodiments, elements, components, regions, layers and/or sections, these embodiments, elements, components, regions, layers and/or sections should not be limited by these terms. These terms are only used to distinguish one embodiment, element, component, region, layer or section from another region, layer or section. Thus, a first embodiment, region, layer or section discussed below could be termed a second embodiment, region, layer or section, and, similarly, a second embodiment, region, layer or section could be termed a first embodiment, region, layer or section without departing from the teachings of the present invention.

Figure 2A:
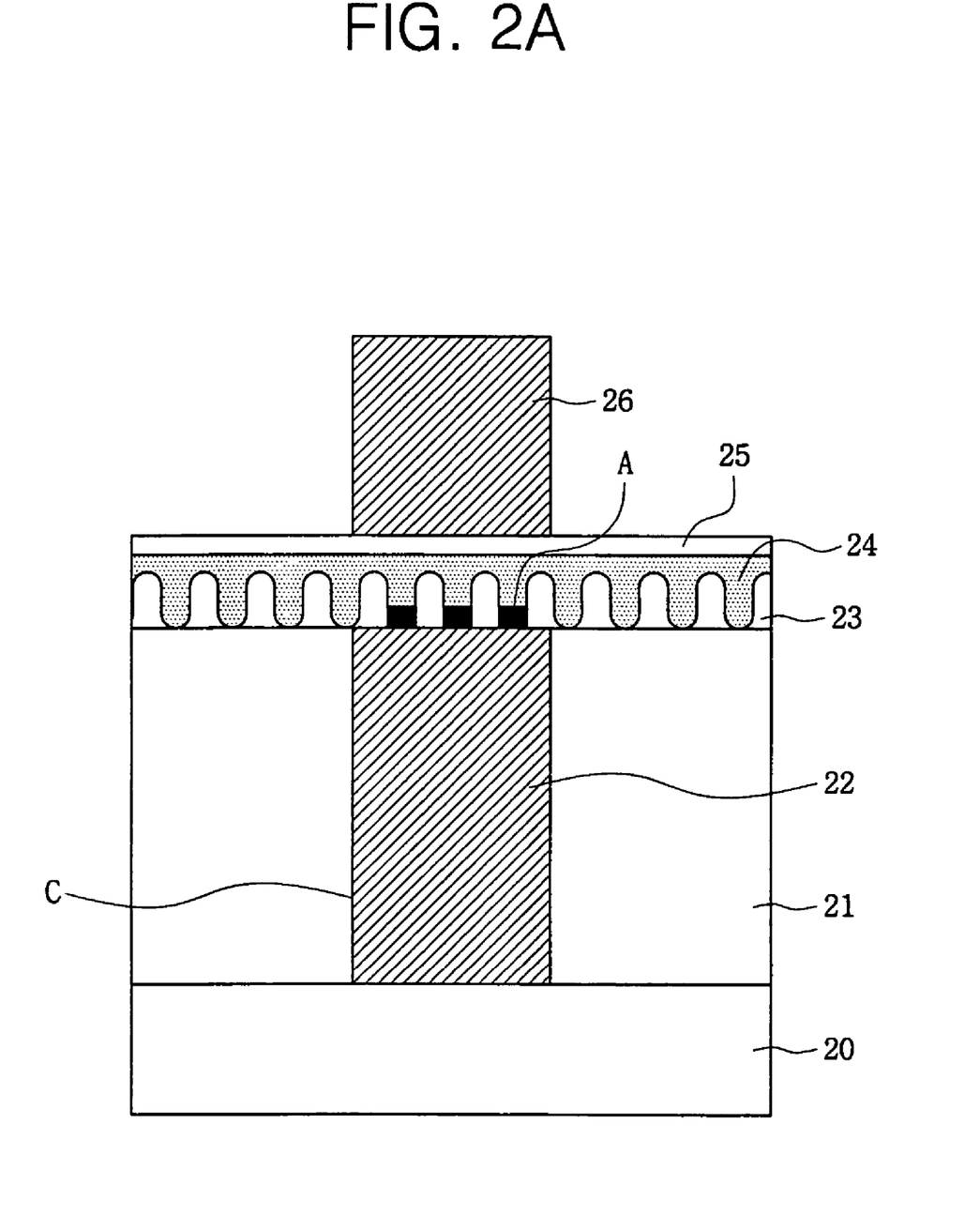
FIGS. 2A and 2B are cross-sectional views illustrating a structure of a phase change memory device according to embodiments of the present invention.
Figure 2B:
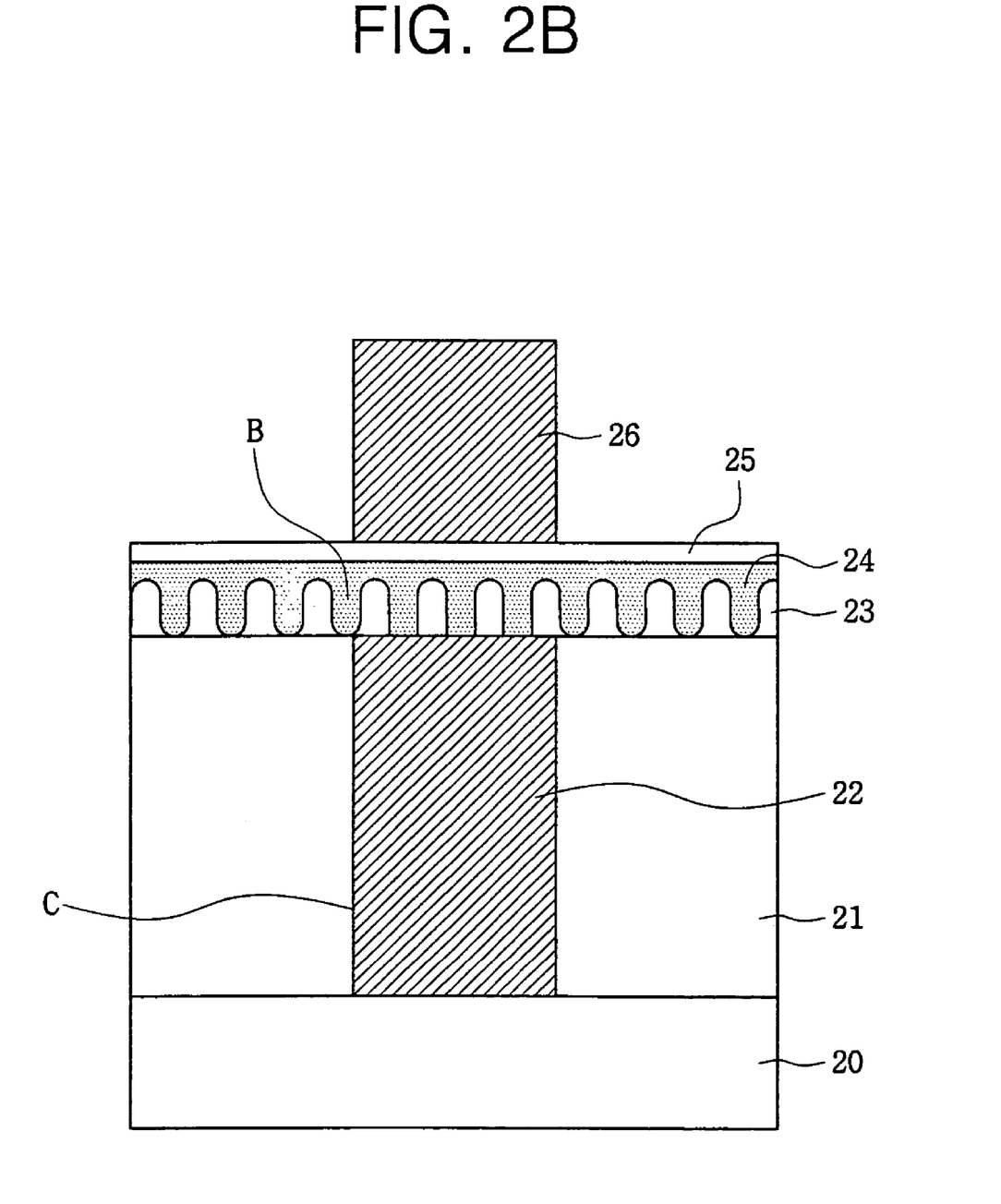

FIGS. 2A and 2B are cross-sectional views illustrating a structure of a phase change memory device according to embodiments of the present invention. As shown in FIGS. 2A and 2B, phase change memory devices according to some embodiments of the present invention comprise a lower electrode 22 in a contact hole C of an interlayer insulating layer 21 on a semiconductor substrate 20 and connected to the semiconductor substrate 20. A porous dielectric layer 23 is provided on the lower electrode 22 and having a plurality of fine pores therein. A phase change layer 24 is provided in the fine pores in some embodiments, filling the fine pores in other embodiments, and on the porous dielectric layer 23 and filling the fine pores in yet other embodiments. A conductive adhesive film 25 is provided on the phase change layer 24, and an upper electrode 26 is provided on the adhesive film 25, remote from the lower electrode.

The lower electrode 22 can comprise TiN, and in some embodiments can have a cylindrical shape. In some embodiments, the porous dielectric layer 23 comprises $Al_2O_3$. In some embodiments, the phase change layer 24 comprises a Ge—Sb—Te compound. Further, in some embodiments, the adhesive film 25 comprises TiN.

FIG. 2A shows a reset state where the phase change layer is changed into an amorphous state, and FIG. 2B shows a set state where the phase change layer is changed into a crystal state. Reference numeral 'A' in FIG. 2A shows the reset state where the phase change layer 24 is changed into the amorphous state, and reference numeral 'B' in FIG. 2B shows the set state were the phase change layer 24 is changed into the crystal state.

The adhesive film 25 between the phase change layer 24 and the upper electrode 26 need not be provided in some embodiments. Also, in some embodiments, as shown in FIG. 3, a cross-sectional area of the upper electrode 26A may be larger than that of the lower electrode 22.

Figure 4A:
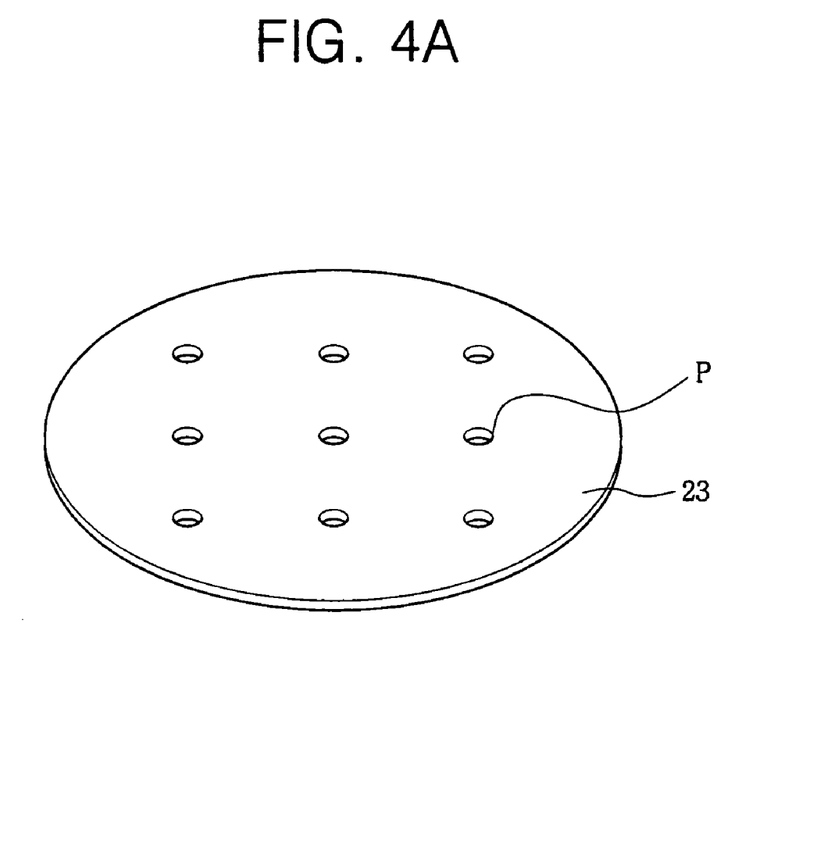
FIG. 4A is a perspective view illustrating a structure of a porous layer constituting a phase change memory device according to embodiments of the present invention.

FIG. 4A is a perspective view illustrating a structure of the porous dielectric layer 23 constituting a phase change memory device of the present invention.

Figure 4B:
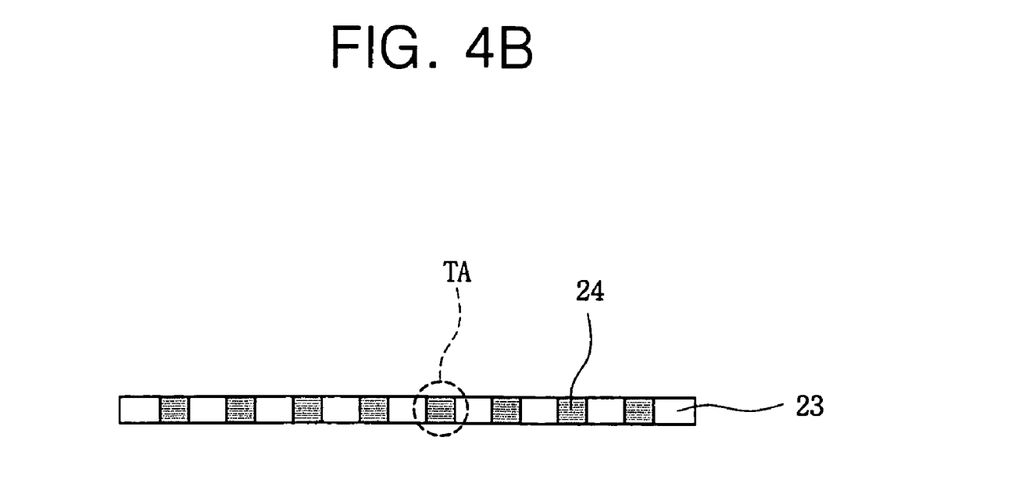
FIG. 4B is a cross-sectional view illustrating that fine pores of a porous dielectric layer are filled with a phase change layer to form a restricted phase transition area within the fine pores according to embodiments of the present invention.

FIG. 4B is a cross-sectional view illustrating a state where fine pores of the porous dielectric layer 23 are filled with the phase change layer 24. The phase change layer is filled into the fine pores of the porous dielectric layer 23 to form a restricted phase transition area TA.

Figure 3:
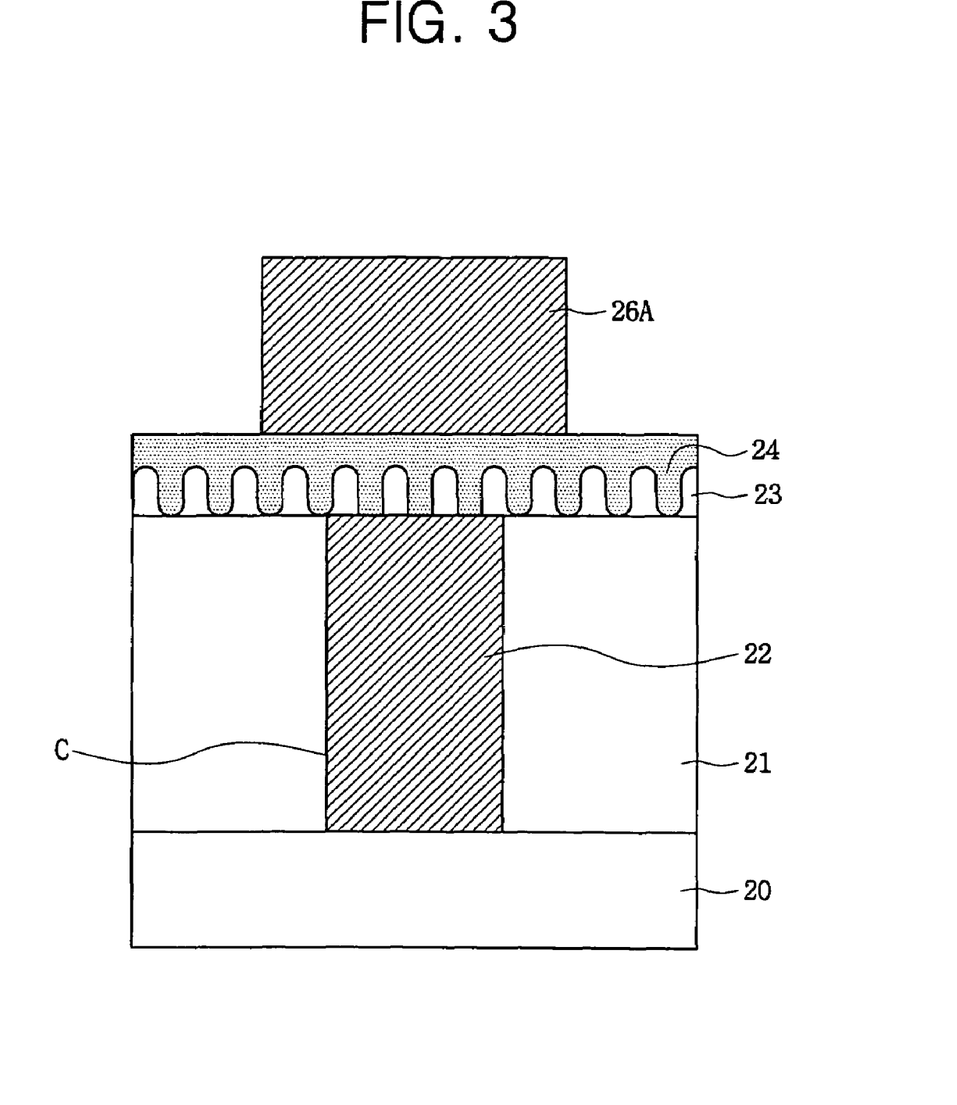
FIG. 3 is a cross-sectional view illustrating a structure of a phase change memory device according to other embodiments of the present invention.

FIGS. 2A-2B, 3 and 4A-4B also illustrate embodiments of the present invention, wherein the phase change layer 24 forms an absenced pattern phase change layer on the lower electrode. For example, as shown in FIGS. 4A and 4B, the absenced pattern phase change layer 24 may comprise an array of islands in the fine pores P of the porous dielectric layer 23. More specifically, in FIGS. 4A and 4B, the absenced pattern phase change layer may be a generally rectangular layer having cutouts therein which define the islands 24 of phase changed material. Other embodiments also may be provided. As also shown in FIGS. 2A, 2B and 3, the absenced pattern phase change layer extends across the lower electrode 22.

Methods for manufacturing phase change memory devices according to embodiments of the present invention will now be described with reference to the accompanying drawings, FIGS. 5A to 5F, and FIGS. 6A and 6B.

Figure 5A:
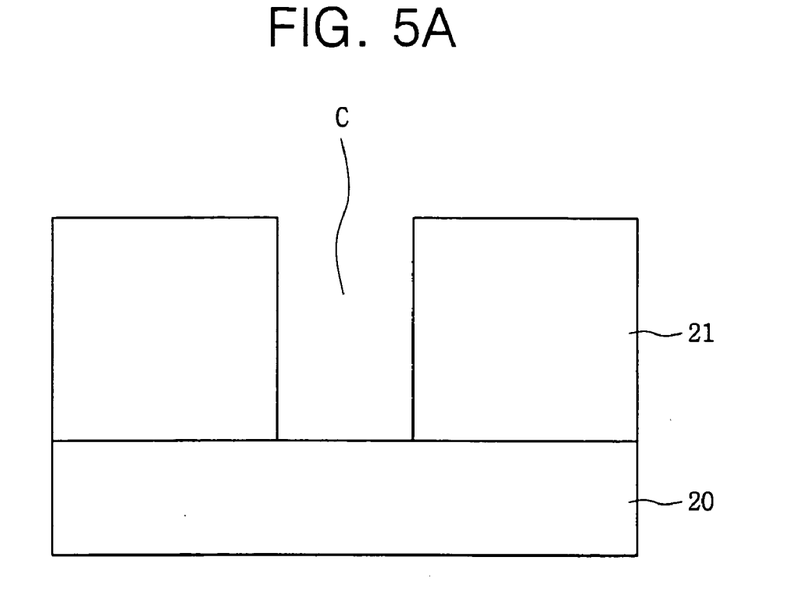
FIGS. 5A to 5F are cross-sectional views of steps of a manufacturing process for a phase change memory device according to embodiments of the present invention.

As shown in FIG. 5A, an interlayer insulating layer 21 formed on the semiconductor substrate 20 is selectively etched to form a contact hole C exposing the surface of the semiconductor substrate 20.

Figure 5B:
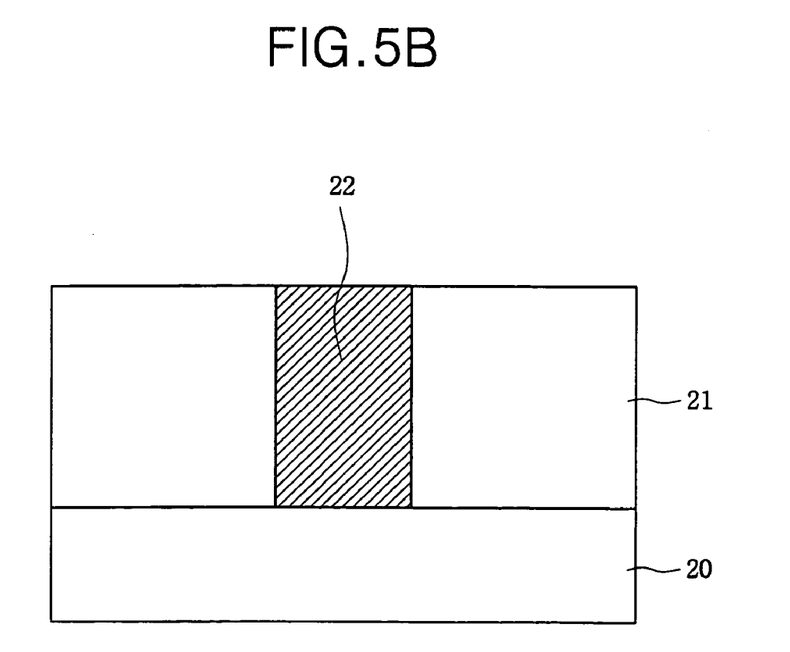

Subsequently, as shown in FIG. 5B, the lower electrode 22 within the contact hole C is formed by forming a conductive film on the semiconductor substrate 20 and in the contact hole C, and removing the conductive film with a chemical mechanical polishing and/or etching process until the surface of the interlayer insulating layer 21 is exposed. The conductive film constituting the lower electrode 22 may be formed with TiN that can have good step coverage, can provide a diffusion barrier and also can have a low resistance.

Figure 5C:
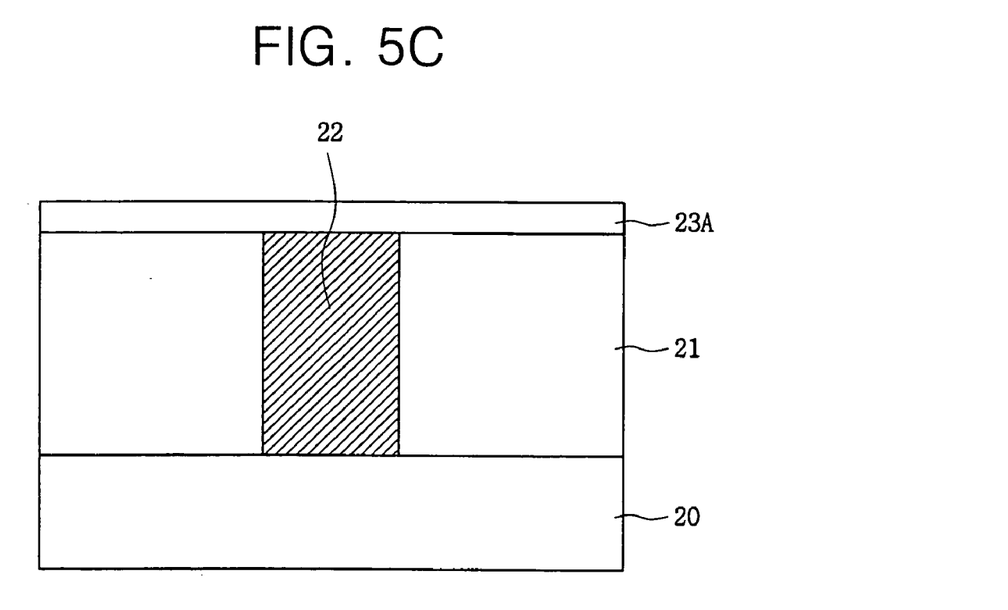

Next, as shown in FIG. 5C, an Al layer 23A is formed on the lower electrode 22 and the interlayer insulating layer 21 in a range of thickness, for example, from about 100 Å to about 200 Å.

Figure 5D:
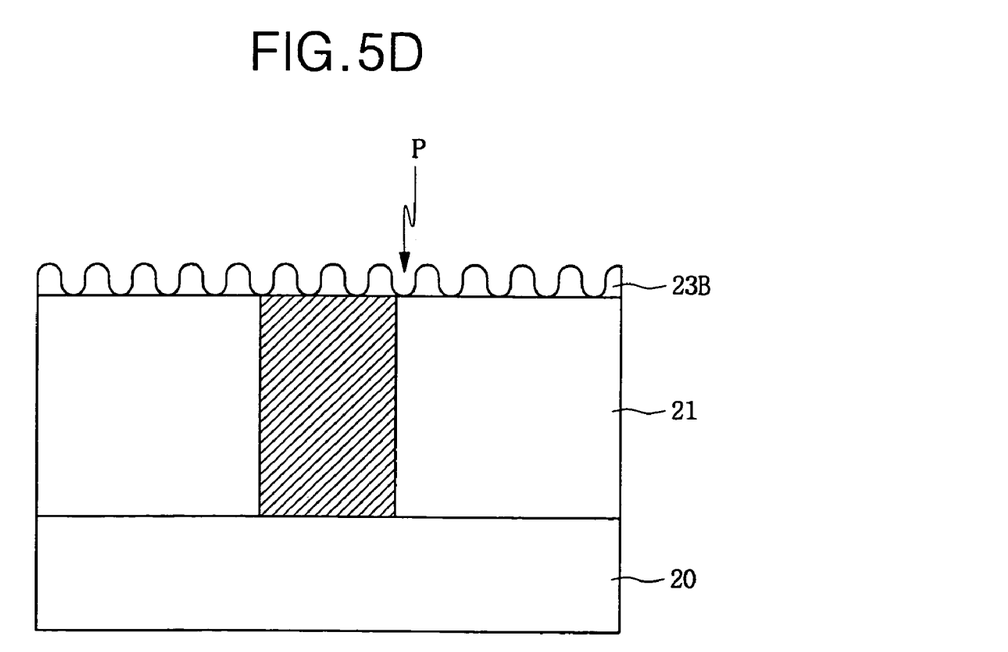
Figure 6A:
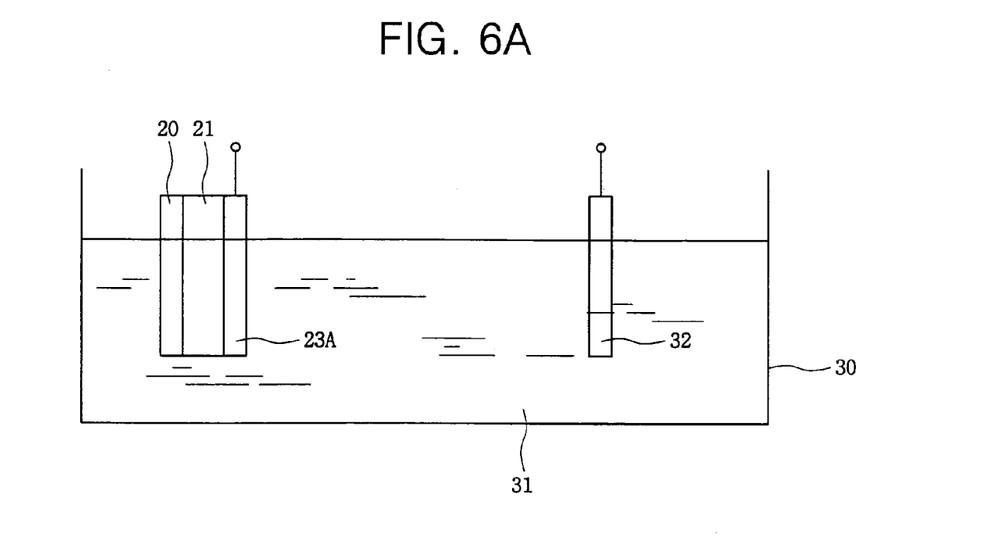
FIGS. 6A and 6B are schematic views illustrating anodizing an Al layer according to embodiments of the present invention.
Figure 6B:
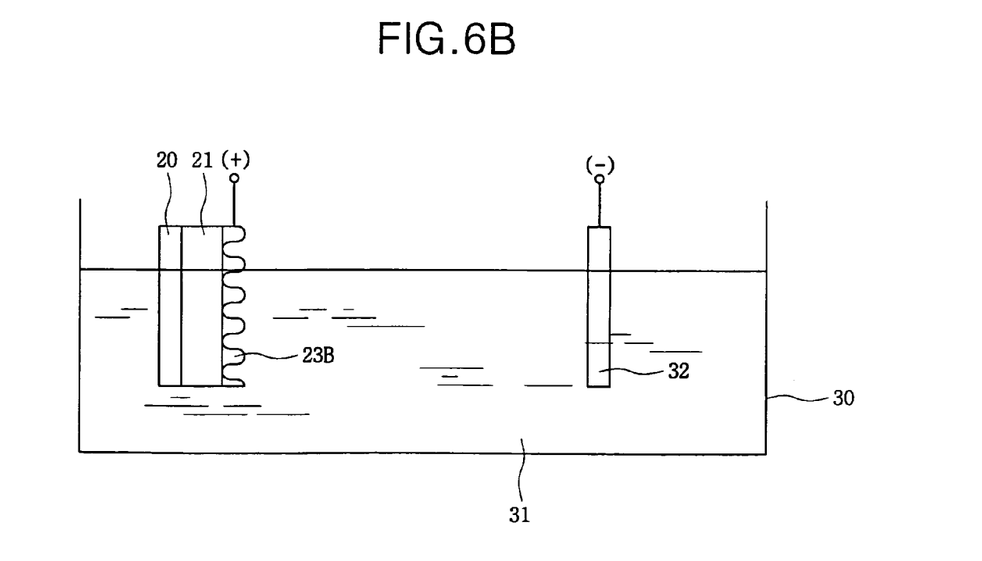

Next, as shown in FIG. 5D, the Al layer 23A is oxidized to form the porous $Al_2O_3$ film 23B having a plurality of fine pores P. In some embodiments, the Al layer 23A is oxidized by an anodizing process to form the porous $Al_2O_3$ film 23B. In some embodiments, as shown in FIG. 6A, an acidic electrolyte solution 31 is provided in an anodizing apparatus 30, and the semiconductor substrate 20 including the Al layer 23A, is dipped into the electrolyte solution 31. An electrode 32 facing the Al layer 23A is placed in the electrolyte solution 31. The electrode 32 comprises Pt and/or carbon. As shown in FIG. 6B, the porous $Al_2O_3$ film 23B is formed by connecting the Al layer 23A to an anode and the electrode 32 to a cathode to provide DC (direct current) and cause oxidation. In some embodiments of the present invention, the electrolyte solution 31 uses oxalic acid, phosphoric acid and/or sulfuric acid. Sizes of the fine pores formed in the porous $Al_2O_3$ film 23B may vary depending on the kind of the electrolyte solution 31 and/or other parameters. For example, when phosphoric acid is used the size of fine pores may be biggest, and when sulfuric acid is used the diameter of fine pores may be smallest. The size of fine pores also can be varied depending on a temperature of the electrolyte solution 31. When the temperature is 0° C. and sulfuric acid is used, fine pores with about 10 nm diameter can be formed.

Figure 5E:
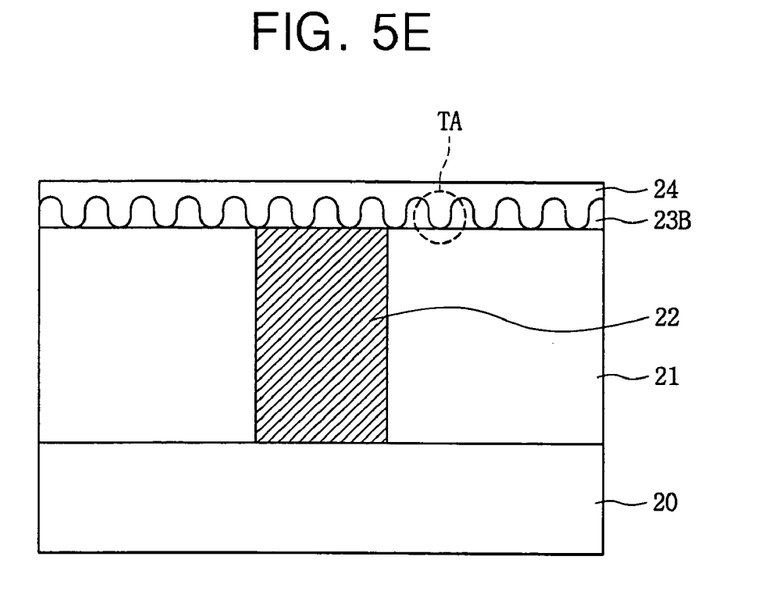

Next, as shown in FIG. 5E, the phase change layer 24 of about 1000 Å thickness is formed on the porous $Al_2O_3$ film 23B to form the restricted phase transition area TA within the fine pores P. In some embodiments, the phase change layer 24 comprises a Ge—Sb—Te compound. In some embodiments, in order to fill the phase change layer 24 into the fine pores P, a reflow process is further performed at about 400° C. to about 600° C. temperature for about 10 to about 15 minutes.

Figure 5F:
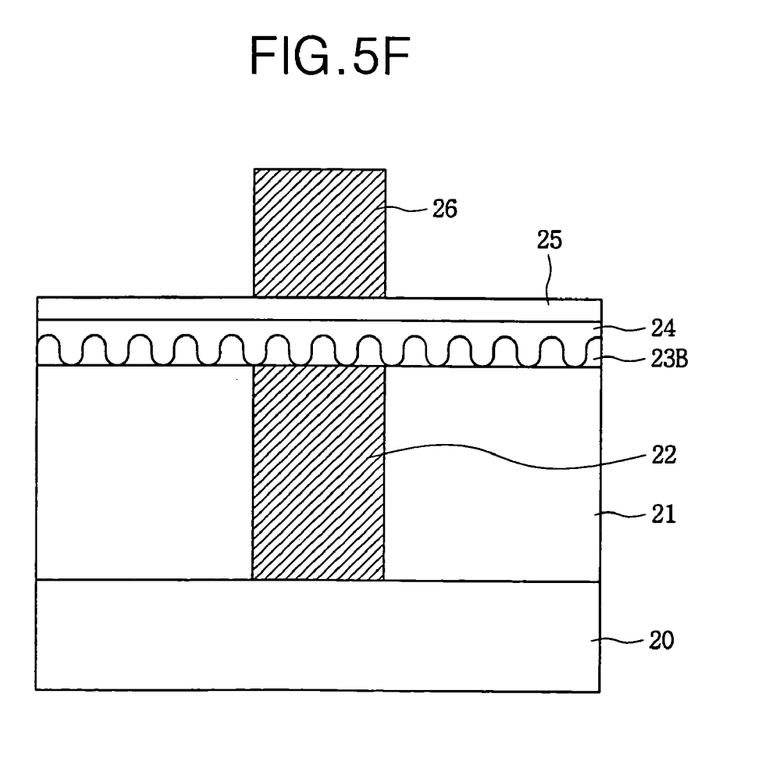

Next, as shown in FIG. 5F, the adhesive film 25 is formed on the phase change layer 24, and the upper electrode 26 is formed on the adhesive film 25. The adhesive film may be formed of TiN of about 1000 Å thickness. The formation of the adhesive film 25 can be omitted in some embodiments, for example, depending on a material constituting the phase change layer 24 and the upper electrode 26.

As described above, some embodiments of the present invention can reduce or minimize the phase transition area by forming the phase transition area within the fine pores of the porous dielectric layer. As the resistance is increased in the reduced phase transition area, reading and writing data can be performed even with small programming current, for example, tens of μA. Furthermore, as the phase transition area is reduced, the crystallization time can be reduced as much as tens of ns.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A phase change memory device comprising:
   a lower electrode;
   a porous dielectric layer on the lower electrode and having a plurality of fine pores therein;
   a phase change layer in the fine pores that is configured to change between an amorphous state and a crystal state; and
   an upper electrode on the phase change layer, remote from the lower electrode.

2. The phase change memory according to claim 1 wherein the phase change layer fills the fine pores.

3. The phase change memory according to claim 1 wherein the phase change layer is on the porous dielectric layer and fills the fine pores.

4. The phase change memory device according to claim 1, wherein the porous dielectric layer comprises $Al_2O_3$.

5. The phase change memory device according to claim 1, wherein the phase change layer comprises a Ge—Sb—Te compound.

6. The phase change memory device according to claim 5, wherein the lower electrode comprises TiN.

7. The phase change memory device according to claim 1, wherein the lower electrode comprises a cylindrical lower electrode.

8. The phase change memory device according to claim 1, wherein a cross-sectional area of the upper electrode is larger than that of the lower electrode.

9. The phase change memory device according to claim 1, further comprising:
   an adhesive film between the phase change layer and the upper electrode.

10. The phase change memory device according to claim 9, wherein the adhesive film comprises TiN.

11. A phase change memory device according to claim 1, further comprising:
    a semiconductor substrate; and
    an interlayer insulating layer on the semiconductor substrate including therein a contact hole;
    wherein the lower electrode is in the contact hole and is connected to the semiconductor substrate.

12. A phase change memory device comprising:
    a lower electrode;
    an absenced pattern phase change layer comprising at least two rows and at least two columns of islands of phase change material in fine pores in a porous dielectric layer on the lower electrode; and
    an upper electrode on the absenced pattern phase change layer, remote from the lower electrode.

13. The phase change memory device according to claim 12 wherein the absenced pattern phase change layer extends across the lower electrode.

* * * * *